(12) United States Patent
Abbey

(10) Patent No.: US 7,170,959 B1
(45) Date of Patent: Jan. 30, 2007

(54) TAILORED RESPONSE CASCADED INTEGRATOR COMB DIGITAL FILTER AND METHODOLOGY FOR PARALLEL INTEGRATOR PROCESSING

(75) Inventor: Duane L. Abbey, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/399,678

(22) Filed: Sep. 21, 1999

(51) Int. Cl.
*H04B 1/10* (2006.01)

(52) U.S. Cl. .................. 375/350; 375/225; 708/313; 708/443; 708/444

(58) Field of Classification Search ............... 375/229, 375/350, 346, 225; 364/724.01, 829; 708/300, 708/313, 443–444
See application file for complete search history.

(56) References Cited

U.S. PATENT DOCUMENTS

| | | | | |
|---|---|---|---|---|
| 5,570,379 A | * | 10/1996 | Sasaki et al. | 714/775 |
| 5,590,065 A | * | 12/1996 | Lin | 708/313 |
| 5,596,609 A | | 1/1997 | Genrich et al. | 375/350 |
| 5,625,358 A | * | 4/1997 | Wilson et al. | 341/143 |
| 5,732,002 A | * | 3/1998 | Lee et al. | 708/313 |
| 5,754,601 A | * | 5/1998 | Horng et al. | 375/350 |
| 5,781,063 A | * | 7/1998 | Kub et al. | 327/552 |
| 5,903,232 A | * | 5/1999 | Zarubinsky et al. | 341/61 |
| 6,057,793 A | * | 5/2000 | Gong et al. | 341/143 |
| 6,111,531 A | * | 8/2000 | Farag | 341/143 |
| 6,408,318 B1 | * | 6/2002 | Fang et al. | 708/313 |
| 6,470,365 B1 | * | 10/2002 | Rahman et al. | 708/313 |

OTHER PUBLICATIONS

"An Economical Class of Digital Filters for Decimation and Interpolation" (Eugene B. Hogenauer, Apr. 1981. IEEE Transactions on Acoustics, Speech, and Signal Processing. vol. ASAP-29, No. 2).*
"High Speed Polyphase CIC Decimation Filters" (Hong-Kui Yang, W. Martin Snelgrove, Circuits and Systems, May 12-15, 1996. ISCAS '96., 'Connecting the World'., 1996 IEEE International Symposium, vol. 2, pp. 229-232).*
"A Partal-Polyphase VLSI Architecture for Very High Speed CIC Decimation Filters"(Yonghong Gao, Lihnog Jia, and Hannu Tenhunen, 1999. Proceedings. Twelfth Annual IEEE International, 1999, pp. 391-395).*
"An Economical Class of Digital Filters for Decimation and Interpolation" by Eugene B. Hogenauer, IEEE Transactions On Acoustics, Speech, and Signal Processing, vol. ASSP-29, No. 2, Apr. 1981.

* cited by examiner

*Primary Examiner*—Jean B. Corrielus
(74) *Attorney, Agent, or Firm*—Nathan O. Jensen; Kyle Eppele

(57) ABSTRACT

A tailored response cascaded integrator comb digital filter is disclosed which has a cascaded integrator structure, a cascaded comb structure, a first rate change component, a second rate change component and can additionally include a resonator. The improved structure achieves greater bandwidth without requiring higher sampling rates. In an additional embodiment, a pre-decimated cascaded integrator filter section for a cascaded integrator comb digital filter is disclosed as having a data rate change component and a first integrator structure receiving data at the rate established by the data rate change component and modifying the received data. The pre-decimated filter section can also include a second integration structure. The pre-decimate structure outputs data equivalent to data that would be output by a post-decimated cascaded integrator structure having an equal number of cascaded integrator stages.

10 Claims, 16 Drawing Sheets

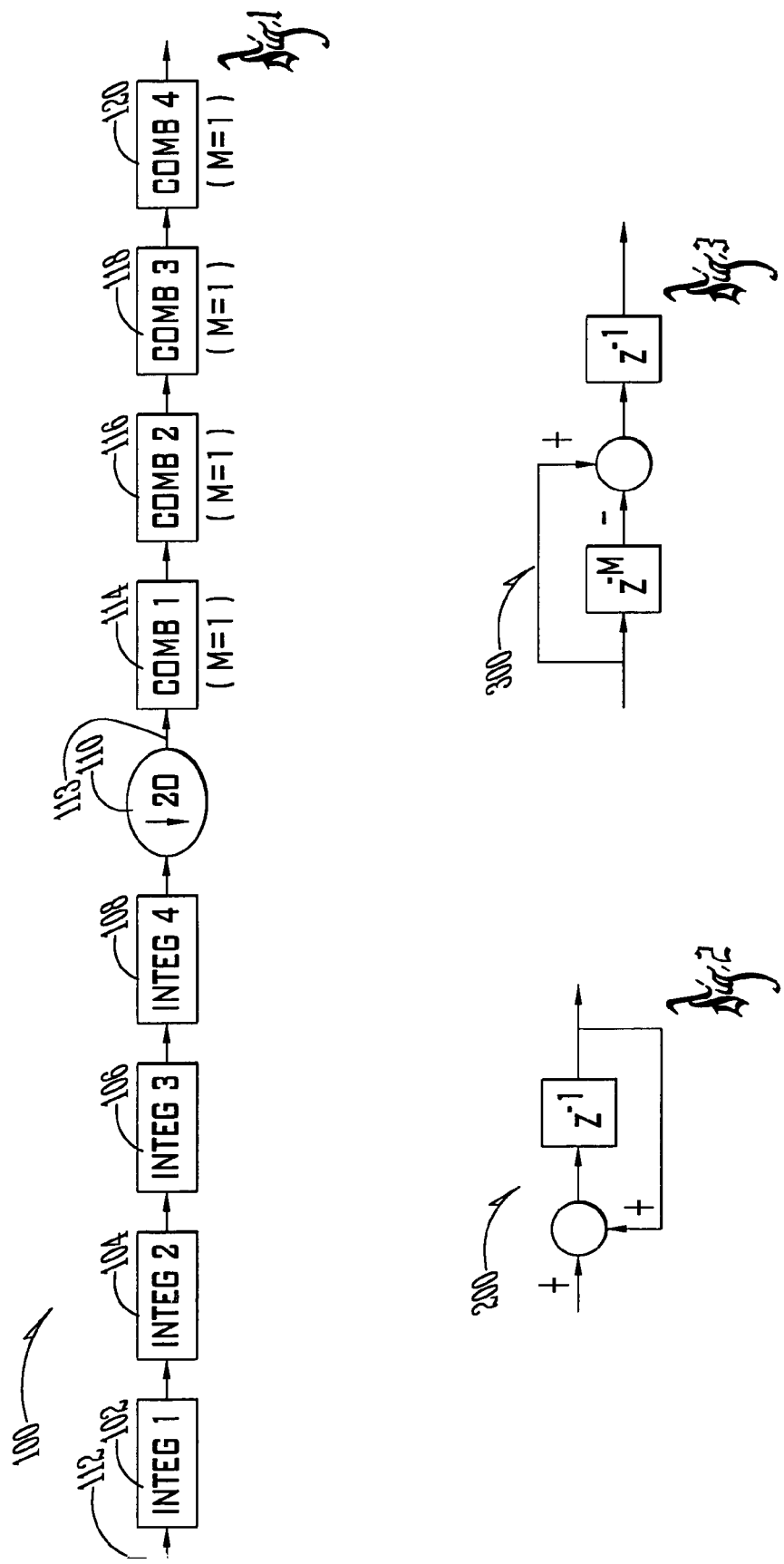

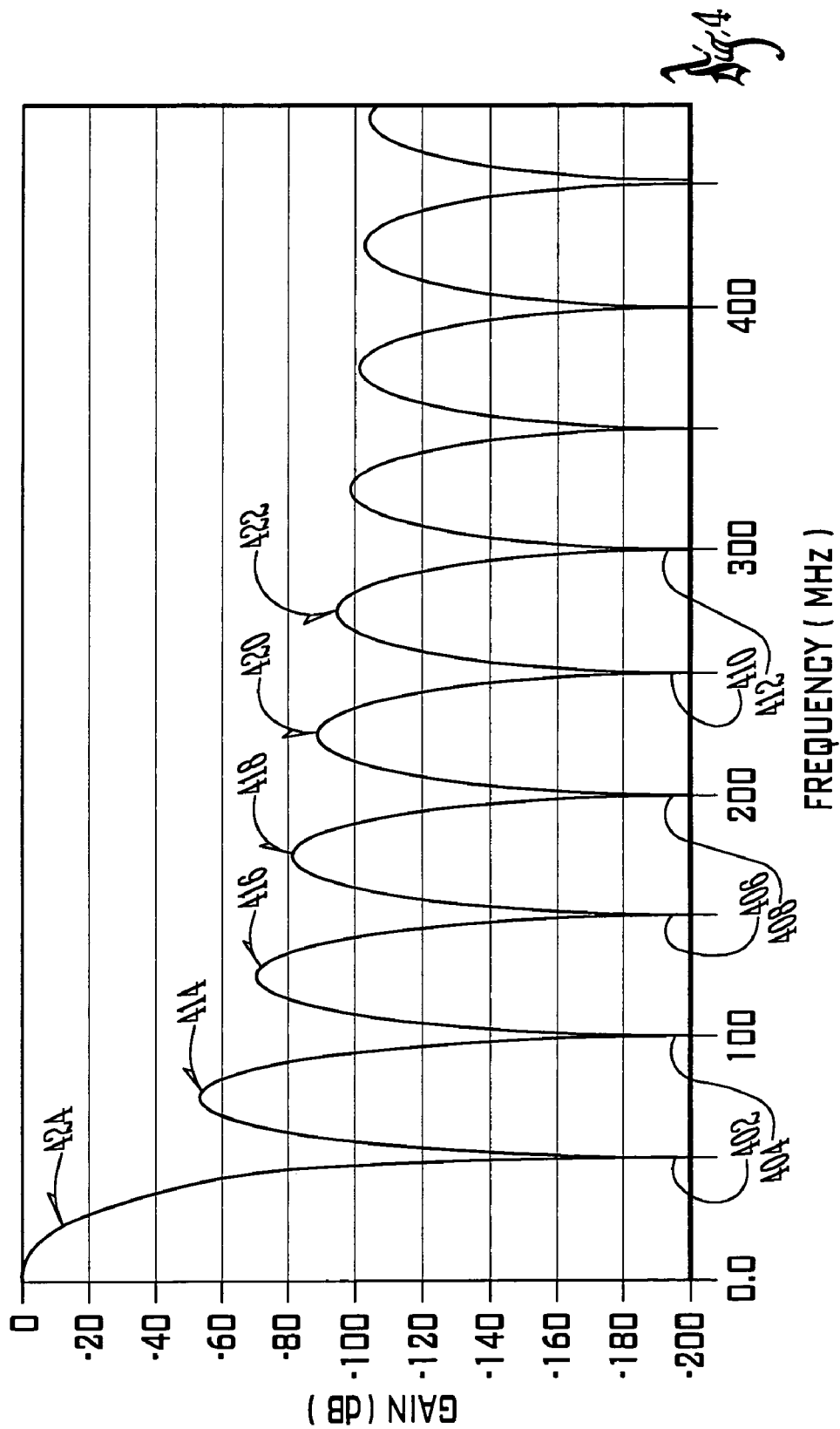

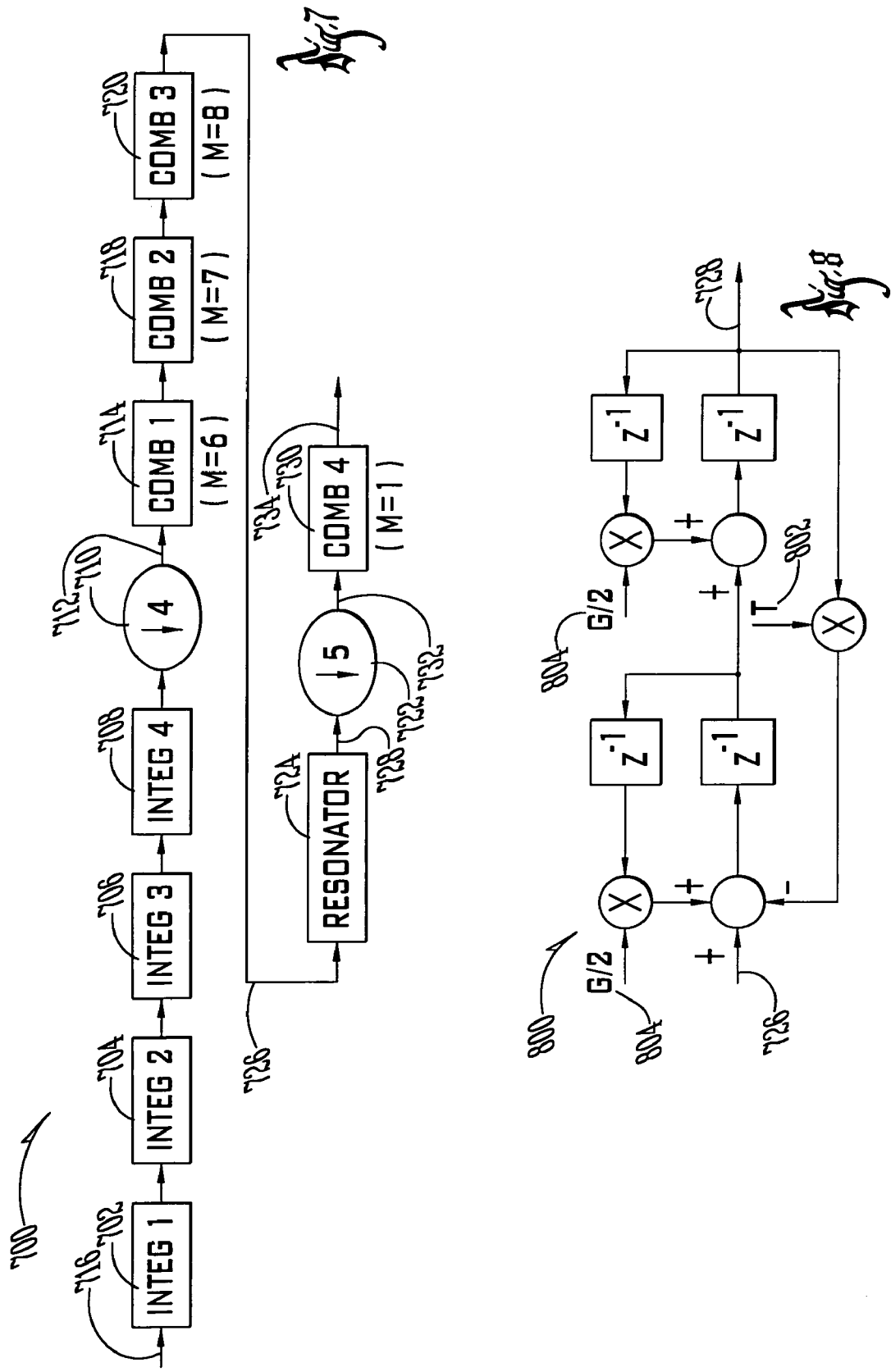

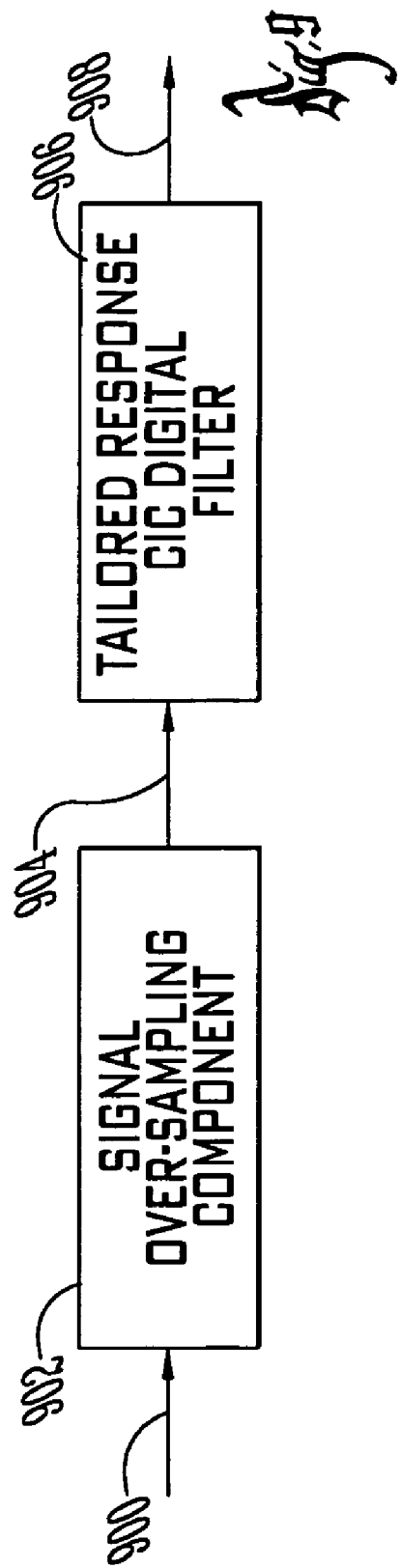

| | |
|---|---|
| 1 STAGES | 0, A, A+B, A+B+C, A+B+C+D, A+B+C+D+E,... |
| 2 STAGES | 0, 0, A, 2A+B, 3A+2B+C, 4A+3B+2C+D, 5A+4B+3C+2D+E,... |
| 3 STAGES | 0, 0, 0, A, 3A+B, 6A+3B+C, 10A+6B+3C+D, 15A+10B+6C+3D+E,... |
| 4 STAGES | 0, 0, 0, 0, A, 4A+B, 10A+4B+C, 20A+10B+4C+D, 35A+20B+10C+4D+E,... |
| 5 STAGES | 0, 0, 0, 0, 0, A, 5A+B, 15A+5B+C, 35A+15B+5C+D, 70A+35B+15C+5D+E,... |
| 6 STAGES | 0, 0, 0, 0, 0, 0, A, 6A+B, 21A+6B+C, 56A+21B+6C+D, 126A+56B+21C+6D+E,... |
| 7 STAGES | 0, 0, 0, 0, 0, 0, 0, A, 7A+B, 28A+7B+C, 84A+28B+7C+D, 210A+84B+28C+7D+E,... |
| 8 STAGES | 0, 0, 0, 0, 0, 0, 0, 0, A, 8A+B, 36A+8B+C, 120A+36B+8C+D, 330A+120B+36C+8D+E,... |

Fig. 17

| | |
|---|---|
| 1 STAGES | 0, 1, 1, 1, 1, 1, ... |
| 2 STAGES | 0, 0, 1, 2, 3, 4, 5, 6, 7, 8, 9, 10, 11, ... |
| 3 STAGES | 0, 0, 0, 1, 3, 6, 10, 15, 21, 28, 36, 45, 55, 66, 78, 91, 105, 120, 136, 153, 171, 190, 210, 231, 253, 276, 300, 325, 351, 378, 406, 435, 465, 496, 528, 561, 595, 630, 666, 703, 741, 780, 820, 861, 903, 946, 990, 1035, 1081, 1128, 1176, 1225, 1275, 1326, 1378, 1431, ... |
| 4 STAGES | 0, 0, 0, 0, 1, 4, 10, 20, 35, 56, 84, 120, 165, 220, 286, 364, 455, 560, 680, 816, 969, 1140, 1330, 1540, 1771, 2024, 2300, 2600, 2925, 3276, 3654, 4060, 4495, 4960, 5456, 5984, 6545, 7140, 7770, 8436, 9139, 9880, 10660, 11480, 12341, 13244, 14190, 15180, 16215, 17296, 18424, 19600, 20825, 22100, 23426, 24804, ... |
| 5 STAGES | 0, 0, 0, 0, 0, 1, 5, 15, 35, 70, 126, 210, 330, 495, 715, 1001, 1365, 1820, 2380, 3060, 3876, 4845, 5985, 7315, 8855, 10626, 12650, 14950, 17550, 20475, 23751, 27405, 31465, 35960, 40920, 46376, 52360, 58905, 66045, 73815, 82251, 91390, 101270, 111930, 123410, 135751, 148995, 163185, 178365, 194580, 211876, 230300, 249900, 270725, 292825, 316251, ... |
| 6 STAGES | 0, 0, 0, 0, 0, 0, 1, 6, 21, 56, 126, 252, 462, 792, 1287, 2002, 3003, 4368, 6188, 8568, 11628, 15504, 20349, 26334, 33649, 42504, 53130, 65780, 80730, 98280, 118755, 142506, 169911, 201376, 237336, 278256, 324632, 376992, 435897, 501942, 575757, 658008, 749398, 850668, 962598, 1086008, 1221759, 1370754, 1533939, 1712304, 1906884, 2118760, 2349060, 2598960, 2869685, 3162510, ... |
| 7 STAGES | 0, 0, 0, 0, 0, 0, 0, 1, 7, 28, 84, 210, 462, 924, 1716, 3003, 5005, 8008, 12376, 18564, 27132, 38760, 54264, 74613, 100947, 134596, 177100, 230230, 296010, 376740, 475020, 593775, 736281, 906192, 1107568, 1344904, 1623160, 1947792, 2324784, 2760681, 3262623, 3838380, 4496388, 5245786, 6096454, 7059052, 8145060, 9366819, 10737573, 12271512, 13983816, 15890700, 18009460, 20358520, 22957480, 25827165, ... |
| 8 STAGES | 0, 0, 0, 0, 0, 0, 0, 0, 1, 8, 36, 120, 330, 792, 1716, 3432, 6435, 11440, 19448, 31824, 50388, 77520, 116280, 170544, 245157, 346104, 480700, 657800, 888030, 1184040, 1560780, 2035800, 2629575, 3365856, 4272048, 5379616, 6724520, 8347680, 10295472, 12620256, 15380937, 18643560, 22481940, 26978328, 32224114, 38320568, 45379620, 53524680, 62891499, 73629072, 86900584, 99884400, 115775100, 133784560, 154143080, 177100560, ... |

1700

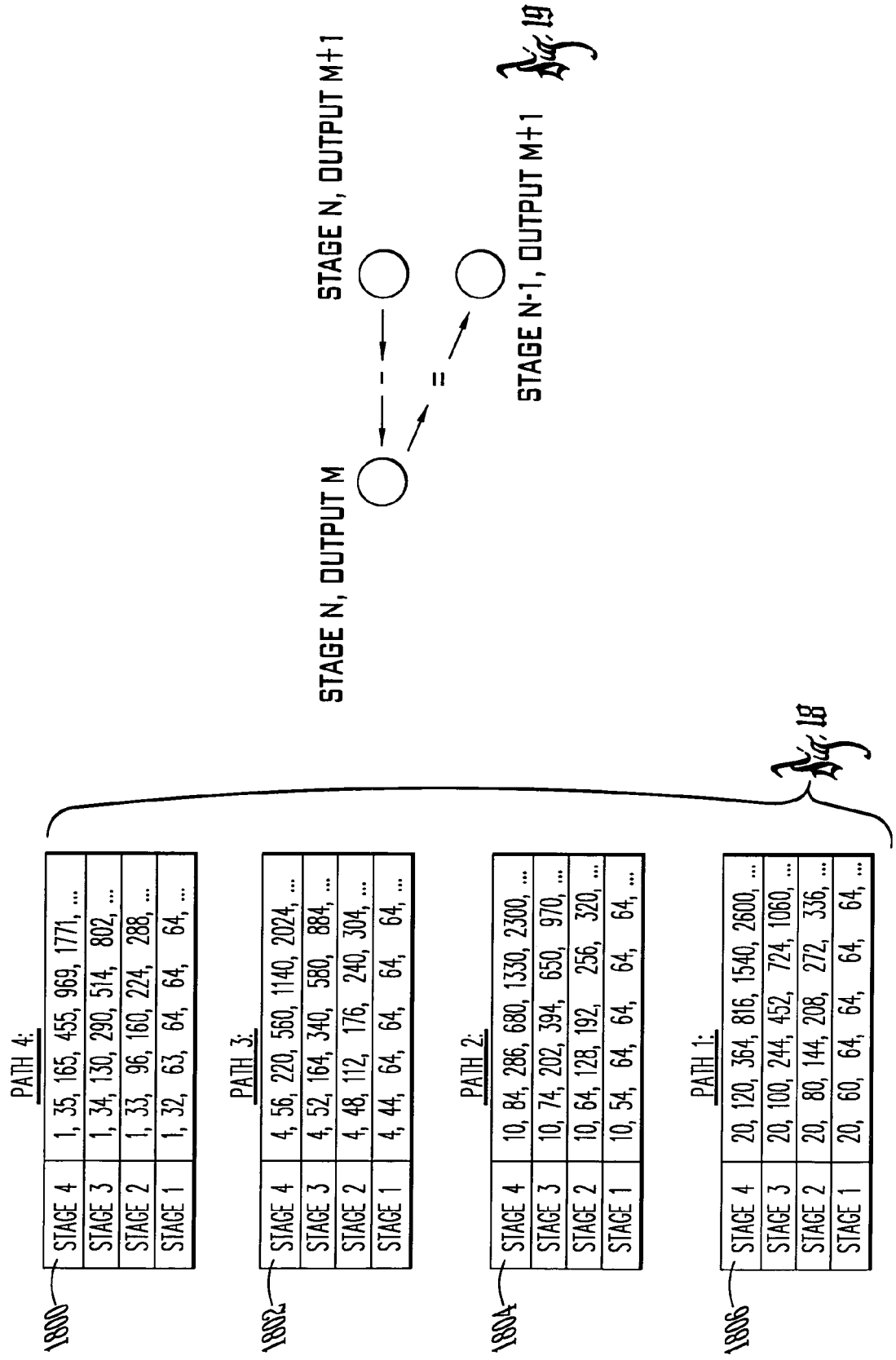

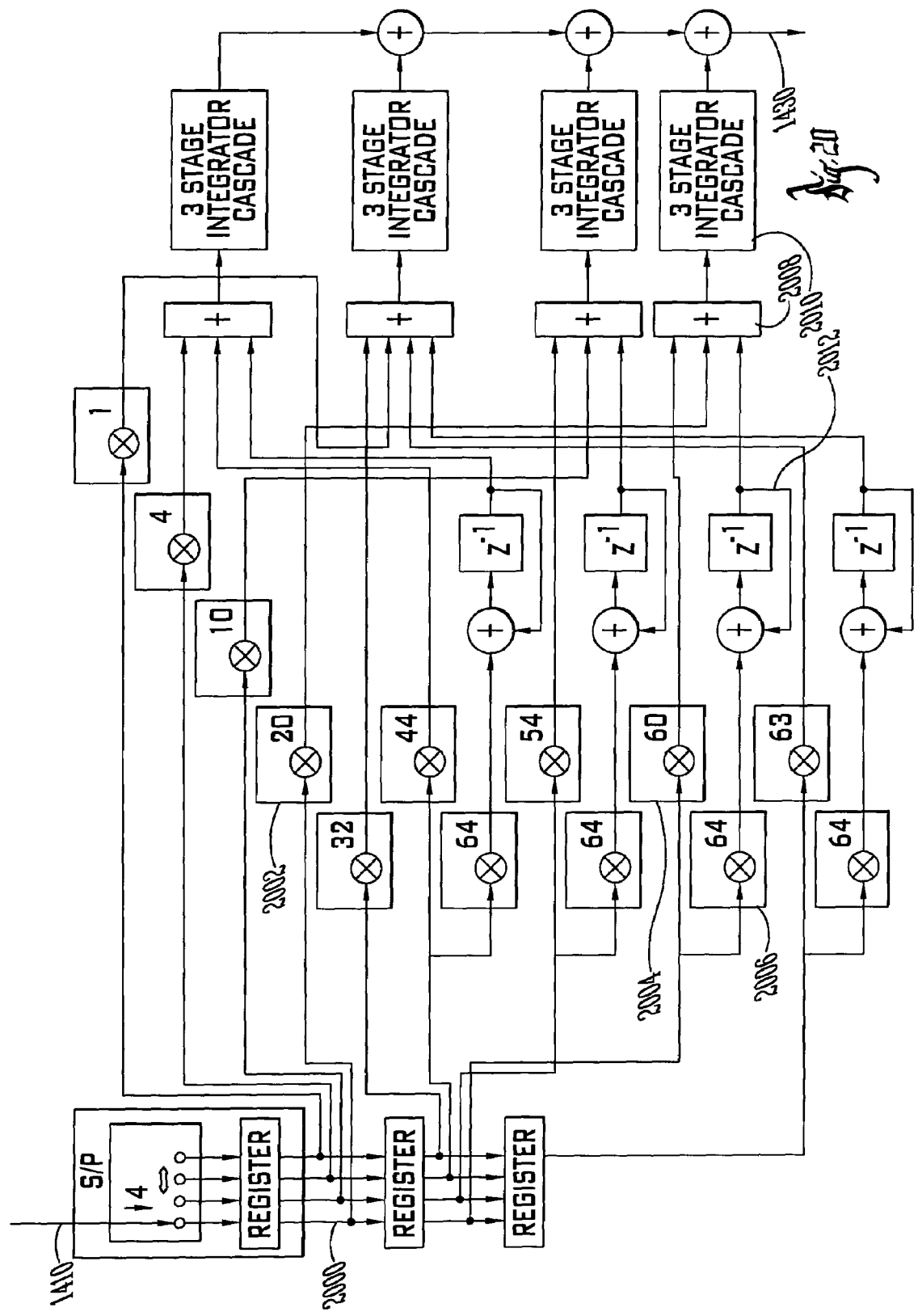

PATH 1:
20A, 120A+20E, 364A+120E+20I, 816A+364E+120I+20M, ...

PATH 2:
10B, 84B+10F, 286B+84F+10J, 680B+286F+84J+10N, ...

PATH 3:
4C, 56C+4G, 220C+56G+4K, 560C+220G+56K+4O, ...

PATH 4:
D, 35D+H, 165D+35H+L, 455D+165H+35L+P, ...

PATH SUM:
20A+10B+4C+D, 120A+84B+56C+35D+20E+10F+4G+H, 364A+256B+220C+165D+120E+84F+56G+35H+20I+10J+4K+L, 816A+680B+560C+455D+364E+286F+220G+165H+120I+84J+56K+35L+20M+10N+4O+P, ...

TAILORED RESPONSE CASCADED INTEGRATOR COMB DIGITAL FILTER AND METHODOLOGY FOR PARALLEL INTEGRATOR PROCESSING

FIELD OF THE INVENTION

The present invention generally relates to improved cascaded integrator comb digital filters and more particularly relates to a tailored response cascaded integrator comb filter as a component of an analog-to-digital converter, and even more particularly relates to a pre-decimated cascaded integrator structure and to a tailored response cascaded integrator comb digital filter having an enhanced dynamic range without requiring a higher sample rate.

BACKGROUND OF THE INVENTION

Standard cascaded integrator comb digital filters are well known in the art. They may be used to perform an interpolation function. Interpolation acts to increase an inputted sample rate. In addition, when the positions of the cascaded integrator and cascaded comb sections have been exchanged, they can provide a decimation function. Decimation accomplishes a reduction of an inputted sample rate.

A decimation function is accomplished in such filters by first processing a received signal with a cascade of integrator stages. Following the last integrator stage, the rate is decimated or reduced by a rate change component. For example, if the rate is to be reduced to one-twentieth of the initial rate, the rate change component will accomplish the reduction by dropping nineteen consecutive samples and outputting each twentieth sample. A cascade of comb stages at the lowered rate then processes the samples output by the rate change component.

Cascaded integrator comb digital decimation filters are becoming widely used to reduce the sample rate of highly over-sampled, numerically represented analog signals. Such filters reduce the sample rate and suppress aliased signal folding interference. In addition, they can be configured to recover resolution sufficient to maintain the desired signal to noise ratio.

Unfortunately, the cascaded integrator comb digital decimation filter has a limited dynamic range when the over-sampling ratio is too low. An additional problem results from the fact that the integrator stages must operate at the higher, pre-decimated rate. This imposes a practical limitation on the data rate that can be input to the cascaded integrator stages. Further, such a structure requires higher speed, higher power and therefore more expensive components.

Various types of cascaded integrator comb digital filters have been disclosed in the art. Among these is a parallel cascaded integrator comb filter that is disclosed in U.S. Pat. No. 5,596,609 to Genrich et al. This filter, however, has an architecture that is fundamentally different from that of the present invention. The Genrich et al. architecture, for example, generates all possible decimated outputs in each stage of the integrator cascade. In addition, the hardware requirements of the Genrich et al. structure are significantly greater.

Consequently, there exists a need for an improved cascaded integrator comb digital filter having improved bandwidth control without requiring higher sample rates. Further, there exists a need for an improved cascaded integrator structure that reduces the input rate prior to processing by the integrator stages.

SUMMARY OF THE INVENTION

It is an object of the present invention to provide an improved cascaded integrator comb digital filter.

It is a feature of the present invention to utilize one or more resonators and multiple rate change components.

It is an advantage of the present invention to achieve greater bandwidth without requiring higher sample rates.

It is another feature of the present invention to perform an alias free rate change prior to initiating processing by the digital filter.

It is another advantage of the present invention to achieve the results of a cascaded integrator comb digital filter using lower power, lower speed and lower cost components.

The present invention includes an apparatus and method for providing an improved cascaded integrator comb digital filter which is designed to satisfy the aforementioned needs, provide the previously stated objects, include the above-listed features and achieve the already articulated advantages. The present invention can be carried out in a cost efficient and "excess-less" manner in the sense that high-speed filter components, capable of handling very high sampling rates, are not required.

Accordingly, the present invention includes a cascaded integrator comb digital filter providing a broader alias protected bandwidth and, in another embodiment, a pre-decimated cascaded integrator structure for a digital filter that is capable of handling faster sampling rates while utilizing lower speed components.

BRIEF DESCRIPTION OF THE DRAWINGS

The invention may be more fully understood by reading the following descriptions of the embodiments of the invention, in conjunction with the appended drawings wherein:

FIG. 1 is a block diagram of one embodiment of the general structure of a cascaded integrator comb digital decimation filter.

FIG. 2 is a more detailed view of one of the integrator stages of the decimation filter depicted in FIG. 1.

FIG. 3 is a more detailed view of one of the comb stages of the decimation filter depicted in FIG. 1.

FIG. 4 is a graphical representation of the performance of the decimation filter depicted in FIG. 1, with a 1 GS per second input rate.

FIG. 7 is a block diagram of one embodiment of a tailored response cascaded integrator comb decimation filter incorporating the teachings of the present invention.

FIG. 8 is a more detailed view of a resonator stage capable of being used in the tailored response cascaded integrator comb digital decimation filter depicted in FIG. 7.

FIG. 9 is a block diagram depicting a tailored response cascaded integrator comb digital filter coupled with a signal over-sampling component.

FIG. 17 is a table depicting the sequence of coefficients of the "A" terms listed in FIG. 15, as extended using the method of FIG. 16.

FIG. 18 is a set of tables, relating to the four pre-decimate by four signal processing paths and the four integration stages of FIG. 14, as well as containing the 4 stage "A" term coefficients of FIG. 17 distributed as stage 4 path coefficients.

FIG. 19 depicts an algorithm for determining stage 1, stage 2 and stage 3 entries for any of the tables depicted in FIG. 18 as a function of two already determined table entries.

FIG. 20 is a block diagram of a pre-decimate by four, four integrator cascade structure, in accord with the teachings of the present invention, utilizing coefficients of the stage 1 lines of the tables of FIG. 18 as the multipliers.

FIG. 21 is a table depicting the output sequence of a four stage post-decimate by four integrator structure, such as the post-decimate integrator structure of FIG. 13.

FIG. 22 is a set of tables depicting the output sequence of a four stage pre-decimate by four integrator structure, such as the pre-decimate integrator structure of FIG. 14 and FIG. 20.

DETAILED DESCRIPTION

Figure 5:
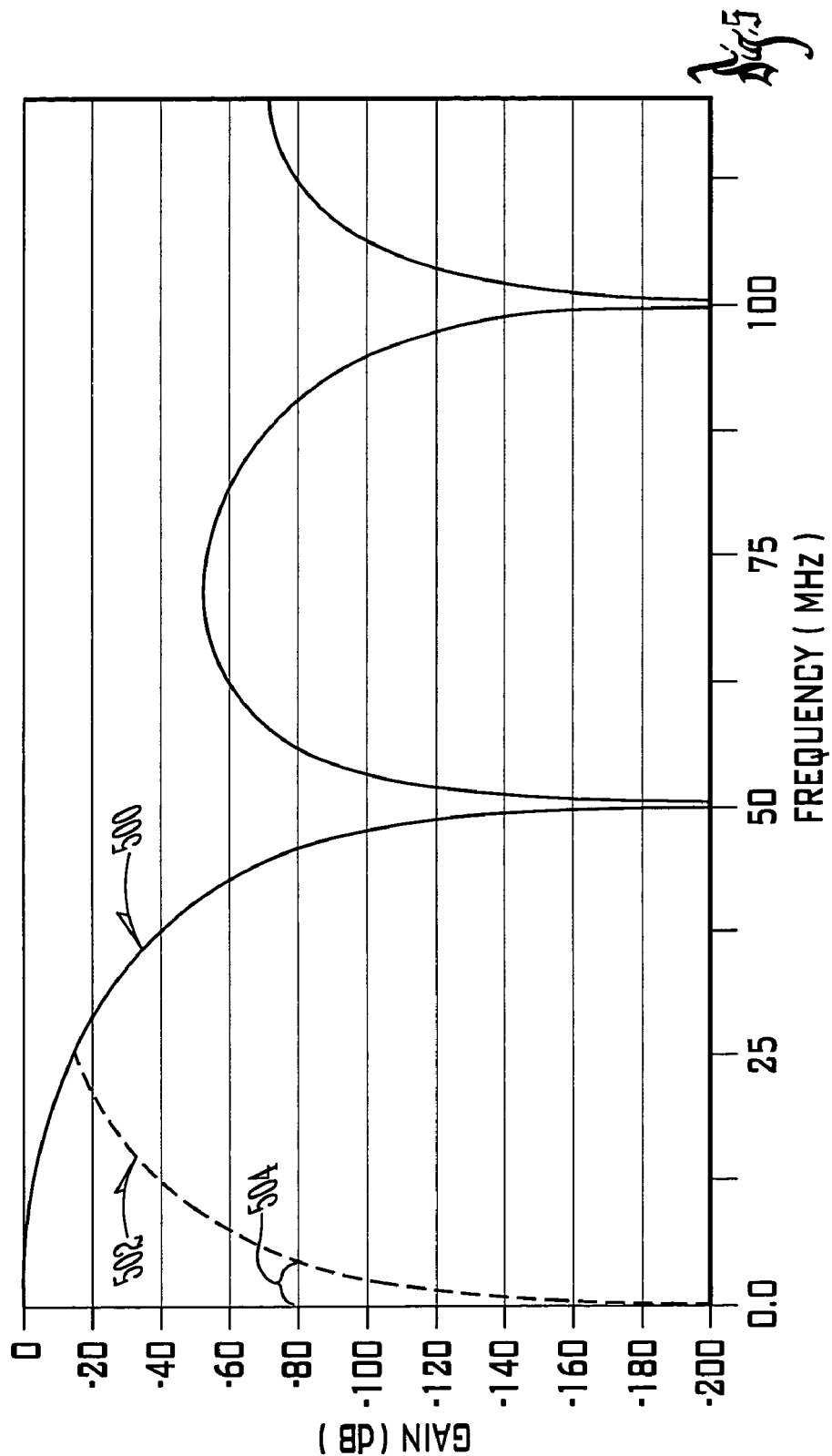
FIG. 5 is a magnified view of a portion of the graphical representation of FIG. 4.

Now referring to the drawings, wherein like numerals refer to like matter throughout, there is shown in FIG. 1 an embodiment of a standard cascaded integrator comb (CIC) digital filter. Cascaded integrator comb filters may be configured to provide either an interpolation or a decimation function. The filter 100 depicted in FIG. 1 is a CIC digital decimation filter. Decimation filter 100 is a four stage filter having four integrator stages 102, 104, 106, 108 in a cascaded, or serial, orientation. Data output from the fourth integrator stage 108 is decimated by a factor of twenty by a rate change component 110.

In operation, data is input 112 to the first integrator stage 102 at a given rate, for example, a 1 GS per second input rate. When data is output by the fourth integrator stage 108, nineteen of every twenty samples are dropped by rate change component 110. This effectively reduces the input rate of 1 GS/s to a rate of 50 MS/s upon being output 113 from the rate change component 110. In more general terms, data input to the first integrator stage 102 at a rate of $f_s$ is output 113 from the rate change component 110 at a rate of $f_s/R$, where R represents the rate change factor. The rate change factor of twenty in FIG. 1 is merely an example of one possible rate change factor. Other rate change factors are also used in standard CIC digital filters.

After the rate change, the data is processed by four cascaded comb stages 114, 116, 118, 120. Each of the comb stages has a differential delay of one sample (M=1). Other delay values may be used however, but generally no more than M=2 due to dilution of performance. Although not required, both integrator and comb stages may be implemented with a series delay for pipelining the signal flow from stage to stage.

The number of integrator and comb stages depicted in FIG. 1 is representative of only one embodiment of a CIC digital filter. It is required, however, that the number of comb and integrator stages be equal. FIG. 1, for example, shows four integrator 102, 104, 106, 108 and four comb stages 114, 116, 118, 120. Alternatively, other CIC filters may have one, two, three, five or some other number (N) of stages.

FIG. 2 is a typical depiction of an integrator stage 200 such as those depicted by the four integrator stages 102, 104, 106, 108 of FIG. 1. The system function for an integrator stage 200 such as that depicted in FIG. 2 may be represented as $z^{-1}/(1-z^{-1})$. Likewise, FIG. 3 depicts a comb stage 300 such as those depicted by the four comb stages 114, 116, 118, 120 of FIG. 1. The system function for a comb stage 300 such as that depicted in FIG. 3 may be represented as $z^{-1}-z^{-(M+1)}$.

The standard CIC filter is described in detail by Hogenauer, E. B. in "An Economical Class of Digital Filters for Decimation and Interpolation": IEEE Transactions on Acoustics, Speech and Signal Processing, Vol. ASSP-29, No. 2, April 1981, pp. 155–162, which is hereby incorporated herein by reference in its entirety including all figures and appendices.

FIG. 4 depicts a power spectral plot of the typical performance of the standard CIC digital filter depicted in FIG. 1. The input sample rate is 1 GS per second, so the plot is representative of the filter response before decimation and spectral folding. The four comb stages 114, 116, 118, 120 of FIG. 1 place four zeros at each increment (50 MHz, 100 MHz, 150 MHz, 200 MHz, etc.) of the reduced output rate ($f_s/R$) resulting in several notches 402, 404, 406, 408, 410, 412. The roll off of the several side lobe responses 414, 416, 418, 420, 422 is generated by the four integrator stages 102, 104, 106, 108 of FIG. 1.

Figure 6:
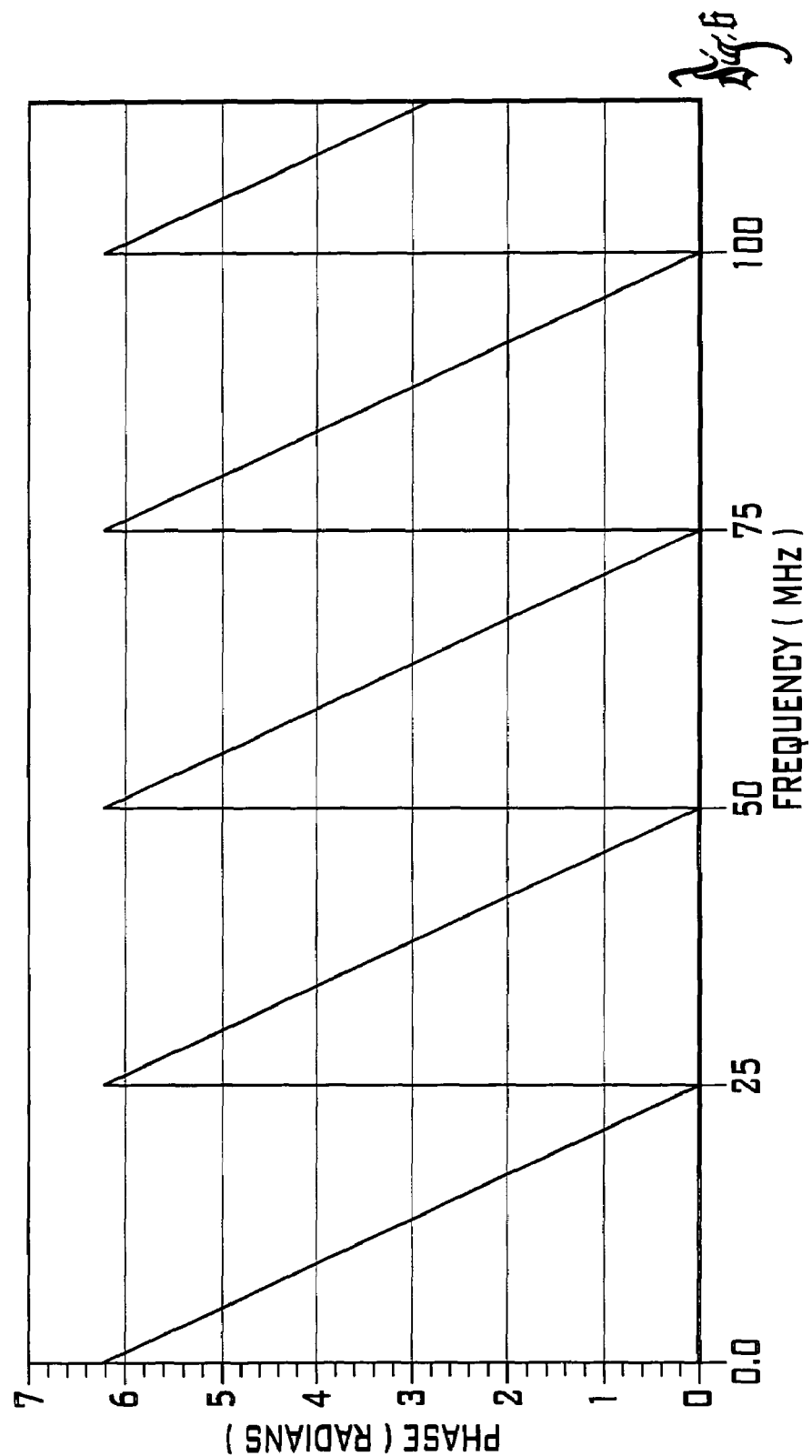
FIG. 6 is a graphical representation of the phase performance of the decimation filter depicted in FIG. 1.

FIG. 5 depicts an enlarged view of the main lobe response 500 of FIG. 5, 424 of FIG. 4. FIG. 5 also depicts the folded noise response 502 after the decimation to 50 MHz. It is noted, for example, that at a signal to noise ratio of 80 dB, there is provided 4.25 MHz of real bandwidth 504. A complex pair of filters would provide +/−4.25 MHz of complex bandwidth. FIG. 6 illustrates that the filter of FIG. 1 is a linear phase filter exhibiting minimal distortion in the signal bandwidth.

FIG. 7 depicts an embodiment of a tailored response CIC digital filter 700 of the present invention. The tailored response CIC digital filter 700 is an embodiment of a four stage decimation filter having four integrator stages 702, 704, 706, 708 in a cascaded orientation. Data output from the fourth integrator stage 708 is decimated by a factor of four by a rate change component 710. Data is then passed 712 from the rate change component 710 to a comb stage 714 at the first reduced rate.

For example, for a 1 GS/s input rate 716 ($f_s$), the output 712 from the rate change component 710 has a rate of 250 MS/s ($f_s/R_1$). The first rate change factor of four in FIG. 7 is merely an example of one possible rate change factor. Other rate change factors may also be used. For example, other embodiments of the present invention have different numbers of stages, different rate change factors, and possibly different numbers of rate change elements, all in appropriate combination for the desired level of performance.

Data output from the rate change component 710 is processed by three cascaded comb stages 714, 718, 720. The notch width (see 1002, 1004, 1006 or 1008 of FIG. 10) at multiples of the lowered rate can be broadened by tailoring the delay length (M) at the higher sample rates. The broadened notches result in a wider alias-protected bandwidth following final decimation by a second rate change component 722.

In the embodiment of FIG. 7, each of the comb stages has a different delay length. The first comb stage 714 has a differential delay of six samples (M=6). The second 718 and third 720 comb stages have differential delays of seven (M=7) and eight (M=8) samples respectively. In other embodiments, other delay values may be used.

Data output by the third comb stage 720 is input to 726 and processed by a resonator stage 724. One type of resonator suitable for use with the present invention is the corner resonator stage 800 depicted in FIG. 8. It will be appreciated that other types of resonators and/or multiple resonators can be used in other embodiments of the present invention. Data output 728 from the resonator 724 of FIG. 7, 800 of FIG. 8, is input to the second rate change component 722.

Figure 10:
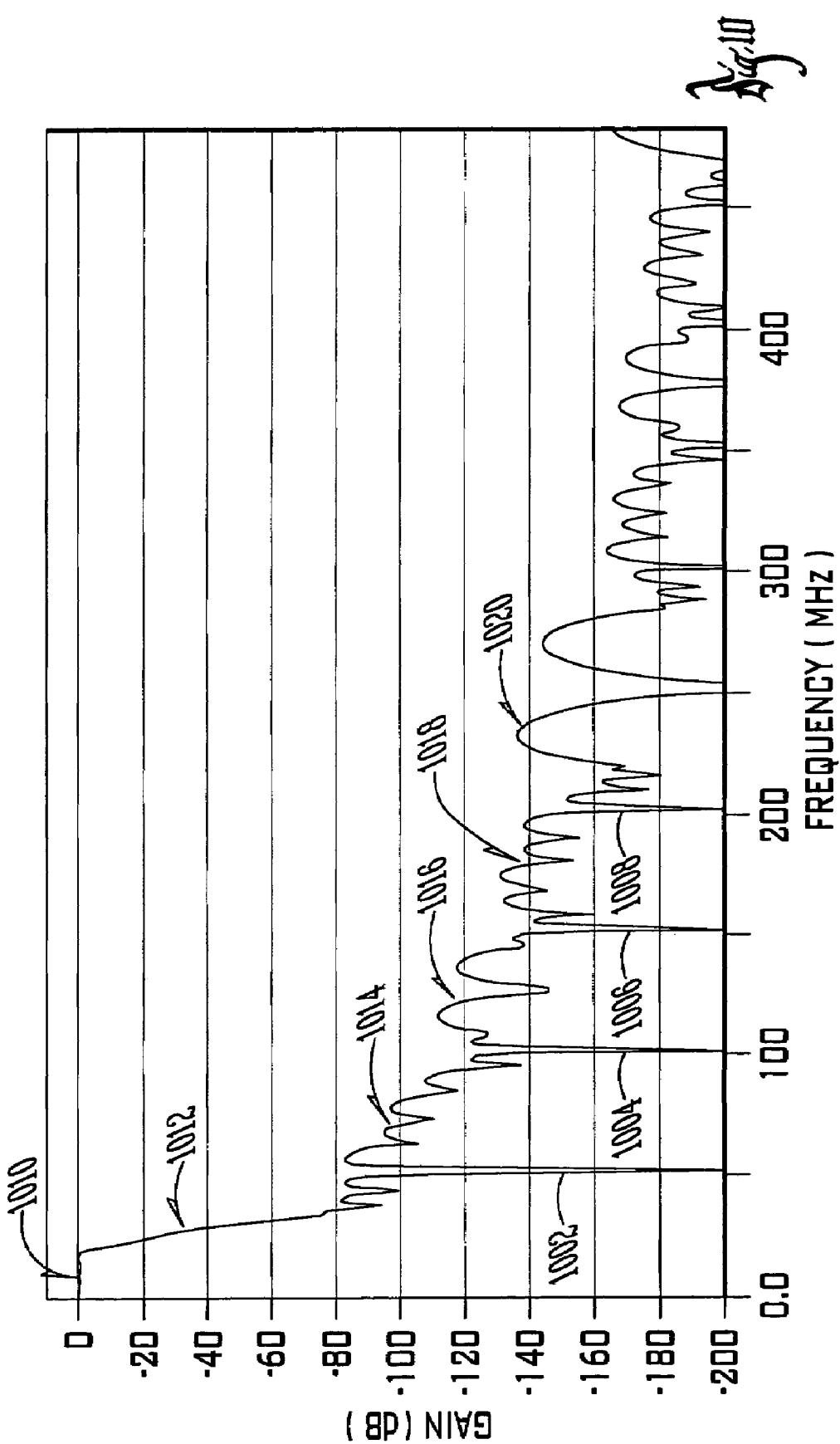
FIG. 10 is a graphical representation of the performance of the tailored response cascaded integrator comb digital filter depicted in FIG. 7, with a 1 GS per second input rate.

Referring to the resonator 724 of FIG. 7, 800 of FIG. 8, the "T" value 802 of the resonator is set such that the low pass resonance corner frequency flattens and widens the pass band (see 1010, FIG. 10) of the main response lobe 1012, FIG. 10. The "G" value 804 of the resonator 724 of FIG. 7, 800 of FIG. 8, is set to control the amplitude of the resonator output at the main lobe corner frequency.

Data received by the second rate change component 722 is decimated by a factor of five and is passed at the second reduced rate to a fourth comb stage 730. For example, for the 250 MS/s reduced rate output 712 from the first rate change component 710 ($f_s/R_1$), the output 732 from the second rate change component 722 has a second reduced rate of 50 MS/s (($f_s/R_1$)/$R_2$). As with the first rate change factor ($R_1$) of four, the second rate change factor ($R_2$) of FIG. 7 is also merely an example of one possible rate change factor. Other rate change factors may also be used.

The fourth comb stage 730 has a differential delay of one sample (M=1). The fourth comb stage 730 also adds its contribution to each of the notches 1002, 1004, 1006 or 1008 of FIG. 10 positioned at integer multiples (50 MHz, 100 MHz, 150 MHz, etc.) of the second reduced rate. Finally, the fourth comb stage 730 outputs its data 734 to the next component of the system at the second reduced rate.

FIG. 9 depicts the general relationship of the tailored response CIC digital filter of the present invention to other cooperating components. In FIG. 9, a signal 900 is received and is processed by a signal over-sampling component 902. The signal over-sampling component 902 can be virtually any component providing an over-sampling of a signal 900. For example, in one embodiment the signal over-sampling component 902 can be a delta-sigma modulator sampling a signal 900 at a rate of $f_s$.

The signal over-sampling component 902 outputs 904 an "n" bit data element to the tailored response CIC digital filter 906. The "n" bit data element will typically be a one bit element, but other embodiments may pass an element having a greater number of bits. The tailored response CIC digital filter 906 receives the data element at the input rate of $f_s$. After processing, the tailored response CIC digital filter 906 outputs 908 an "m" bit data element at the reduced rate of $f_s/R$. The number of bits output 908 by the tailored response CIC digital filter 906 is determined as a function of the in-band noise suppression desired and/or available after decimation.

The tailored response CIC digital filter 906 can be the decimation filter disclosed above in relation to FIGS. 7 and 8. The structure of FIG. 9 would be particularly useful, for example, in a delta-sigma modulator type analog to digital converter. The present invention permits use of lower speed, lower power and lower cost components for the filter than would otherwise be possible. Further, the present invention facilitates development of high dynamic range/wide bandwidth analog to digital converters. It will also facilitate development of a direct sampling communications receiver.

FIG. 10 depicts a power spectral plot of the typical performance of the tailored response CIC digital filter depicted in FIG. 7. The input sample rate is 1 GS per second, so the plot is representative of the filter response before decimation and spectral folding. The four comb stages 714, 718, 720, 730 of FIG. 7 place zeros at different frequencies (and multiples thereof) determined by "$f_s(R*M)$." Multiples of 31.25 MHz, 35.7 MHz, 41.7 MHz and 50 MHz are produced for M=8, 7, 6 and 1 respectively. The resulting several notches 1002, 1004, 1006, 1008 are formed from composites of the notch multiple groupings. The faster response roll off of the several side lobe responses 1014, 1016, 1018, 1020 and the wider bandwidth of the main lobe response 1012 is apparent in FIG. 10.

Figure 11:
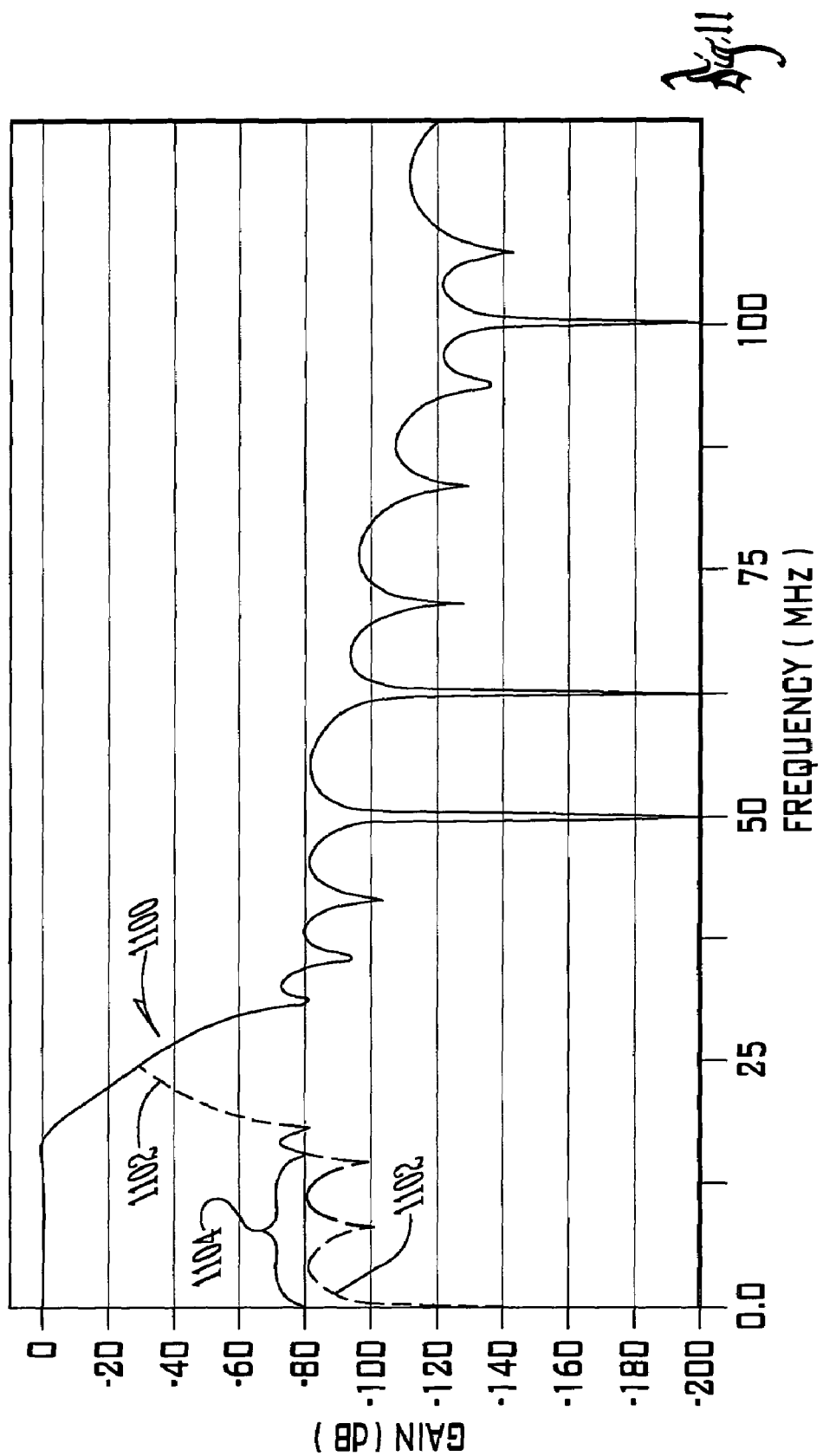
FIG. 11 is a magnified view of a portion of the graphical representation of FIG. 10.
Figure 12:
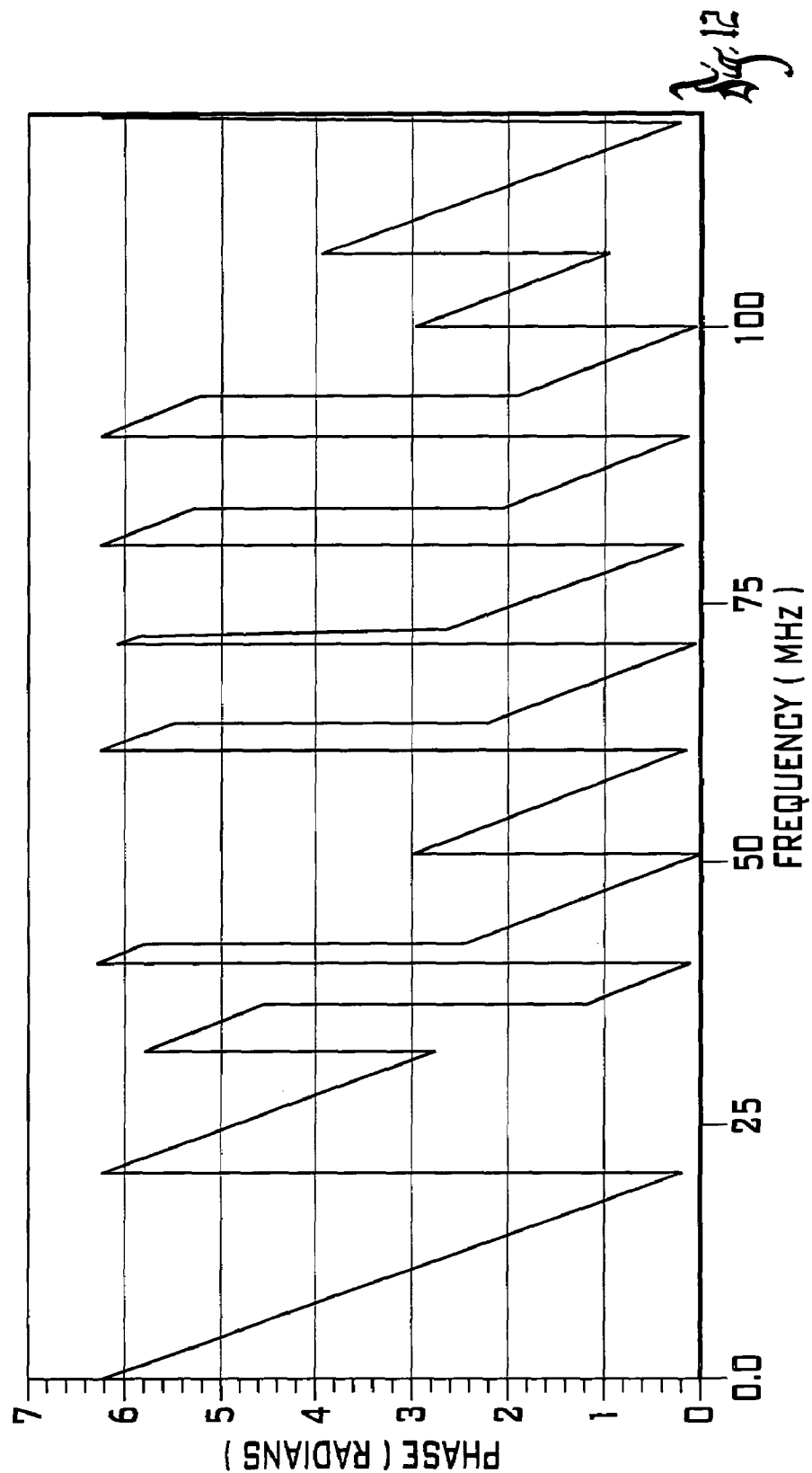
FIG. 12 is a graphical representation of the phase performance of the tailored response cascaded integrator comb digital filter depicted in FIG. 7.

FIG. 11 depicts an enlarged view of the main lobe response 1100 of FIG. 11, 1012 of FIG. 10. Note that the null depth resolution is greater in FIG. 11 than in FIG. 10, but is still limited by the simulation's numeric accuracy. Figure 11 also depicts the folded noise response 1102 after the decimation to 50 MHz. At a signal to noise ratio of 80 dB, there is now provided 16.3 MHz of real bandwidth 1104. A complex pair of filters would provide +/−16.3 MHz of complex bandwidth. This is nearly four times wider than the 4.25 MHz of bandwidth 504 depicted in FIG. 5 in relation to the standard CIC digital filter. FIG. 12 illustrates that, through the signal and transition bandwidths, the filter of FIG. 7 is a linear phase filter exhibiting minimal distortion in the signal bandwidth. The tailored comb stages produce phase jumps in the stop bandwidths, but with no amplitude to corrupt the signal bandwidth after the final decimation.

The tailored response CIC digital decimation filter of the present invention can have any number of integrator and comb stages on a one-for-one basis. By running part or all of the comb stages at a higher sample rate than the output rate, and by using appropriate delay values for each stage, fractional delay values are effectively established at the filter output sample rate. For example, in the embodiment of FIG. 7, with respect to the second rate change factor of five, the delay values of the first 714, second 718 and third 720 comb stages (M=6, M=7, M=8, respectively) equate to values of 6/5, 7/5 and 8/5 at the 50 MS/s output sample rate. These notch placements, and the final notch placement provided by the fourth comb stage 730 at a value of 5/5, result in greatly improved noise suppression over wider pass bands.

Further, the present invention can have intermediate sample rate corner resonators as required to shape the band pass and increase the transition band roll off rate. For example, the tailored response CIC digital decimation filter described in relation to FIG. 7 could include zero, one, two or more such resonators, with resonance frequencies placed to optimize pass bandwidth and minimize pass band ripple.

Figure 13:
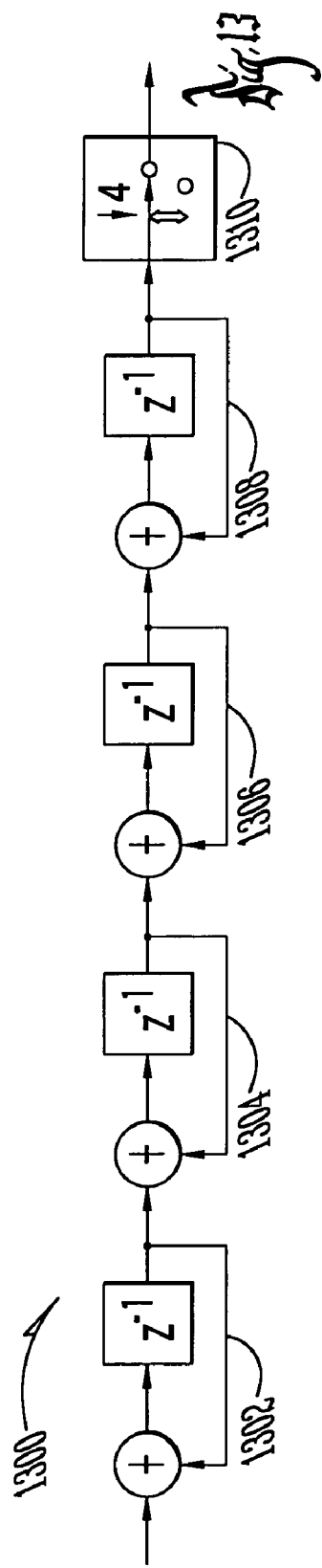
FIG. 13 is a block diagram of the general structure of the post-decimate by four integrator cascade of FIG. 7.

FIG. 13 depicts a cascaded integrator section 1300 with a rate change component 1310. The structure of FIG. 13 is similar to the integrator structure depicted in FIG. 7. The cascaded integrators 1302, 1304, 1306, 1308 correspond to the four integrators 702, 704, 706, 708 of FIG. 7 with the integrator structure of FIG. 2 substituted for each block depiction of FIG. 7. Since the rate change component 1310 performs the decimation after all of the integrator stages have been executed, this structure will be referred to as a post-decimate structure.

Figure 14:
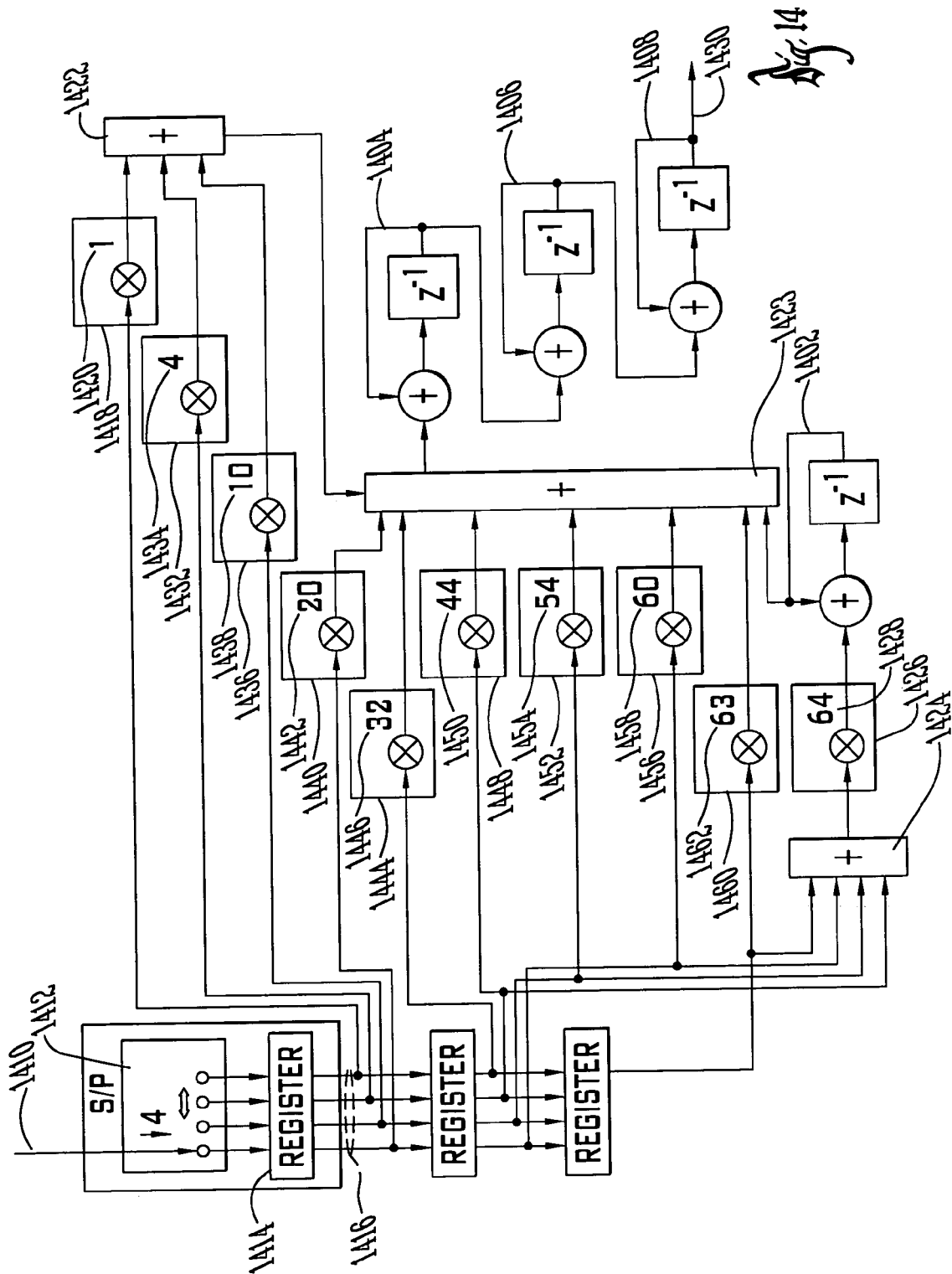
FIG. 14 is a block diagram of a pre-decimate by four, four integrator cascade structure in accord with the teachings of the present invention.

FIG. 14 depicts a parallel processed, pre-decimate by four, four integrator cascade structure (digital filter section) that is functionally equivalent to the filter section of FIG. 13. The filter section of FIG. 14, however, is structurally and operationally different from the functionally equivalent filter of FIG. 13. In the structure of FIG. 14, the decimation or rate change is accomplished prior to processing by any of the integrator stages 1402, 1404, 1406, 1408. When the filter input is demultiplexed (serial to parallel rate reduction by four) as in FIG. 14, the input integrations can be performed at a lower sample rate.

The structure of FIG. 14 could replace the integrator stages 702, 704, 706, 708 and the rate change component 710 of the tailored response CIC digital filter of FIG. 7. Further, structures such as those disclosed in FIG. 14, but having a different number of integrator stages or a different rate change factor, could replace integrator and rate change components of other CIC filters having an equivalent number of integrator stages. For example, if the structure of FIG. 14 included a rate change factor of twenty instead of four, it could replace the integrator stages 102, 104, 106, 108 and the rate change component 110 of the standard CIC digital filter of FIG. 1.

In operation, a serial sampled signal 1410 is input to a serial sample to parallel sample converter 1412. The serial sample to parallel sample converter 1412 and its associated delay register 1414 converts the received serial sample signal 1410 into four delayed parallel signal paths 1416, each path having been decimated by a factor of four. These delayed signal paths, as well as further delayed signal paths, are fed to various multipliers 1418, 1432, 1436, 1440, 1444, 1448, 1452, 1456, 1460 where they are multiplied by the indicated coefficients 1420, 1434, 1438, 1442, 1446, 1450, 1454, 1458, 1462 and summed 1422, 1423 as shown.

The delayed signal paths are also pre-summed 1424. The summation of the pre-summed signals 1424 is input to a multiplier 1426 and multiplied by a coefficient 1428 of sixty-four. The product obtained by the multiplier 1426 is processed by the first integrator stage 1402. The output of the first integrator stage 1402 is then summed into the prior summation 1423. Finally, the output of the final summation 1423 is passed through the second 1404, third 1406 and fourth 1408 integrator stages. If the structure of FIG. 14 was used to replace the integrator stages 702, 704, 706, 708 and the first rate change component 710 of FIG. 7, for example, the output 1430 of the fourth integrator stage 1408 would be input to the first comb stage 714 of FIG. 7.

FIGS. 15–20 illustrate a methodology that can be used to develop the parallel integrator processing structure such as that depicted in FIG. 14. This methodology can be followed in developing various other embodiments of the present invention. For example, the methodology to be disclosed can be used to develop a parallel integrator processing structure having one through eight or more integrator stages. To illustrate the methodology, FIGS. 15 through 20 will be used to generate the structure disclosed in FIG. 14.

Figure 15:
FIG. 15 is a table depicting the output sequence of various integrator structures having different numbers of integrator stages.

FIG. 15 depicts a table that can be used for generating a parallel integrator processing structure having anywhere from one to eight stages. In developing the four integrator stage structure of FIG. 14, the row referring to "4 Stages" 1500 is used. The right-hand column of each row lists the output sequence obtained by passing an input sequence of "A, B, C, D, E . . . ." through a cascade of the indicated number of integrator stages. For example, if a sequence of "A, B, C, D . . . " were input 112 into the four cascaded integrator stages 102, 104, 106, 108, the output of the fourth integrator stage 108 would be "0, 0, 0, 0, A, 4A+B, 10A+4B+C, 20A+10B+4C+D, . . . " as indicated in the "4 Stages" row 1500 of FIG. 15.

Figure 16:
FIG. 16 depicts an algorithm for determining an entry for an integrator output sequence table, such as the sequence table depicted in FIG. 15, as a function of two already determined table entries.

FIG. 16 illustrates a method useful for creating and extending the table of FIG. 15. The next term in a given sequence can be generated from two earlier calculated terms. For instance, the eleventh term 1502 in the sequence for "8 Stages" can be calculated by adding the tenth term 1504 of the "7 Stages" sequence, 28A+7B+C, to the tenth term 1506 of the "8 Stages" sequence, 8A+B. The table can be extended to "9 Stages" by listing a zero for the initial term and by generating the successive terms via the method of FIG. 16. In similar fashion, the table can be extended to include more than nine stages.

FIG. 17 depicts a table listing a sequence of the "A" coefficients or multipliers for each term generated in FIG. 15. Note that the "B" coefficients can be determined from the "A" coefficients of FIG. 15 by using the "A" coefficient of the prior term. In a similar manner, "C," "D," "E," etc., coefficients can be determined from "B," "C," "D," etc., coefficients respectively.

Since a pre-decimate by four integrator structure is being developed with four parallel paths directed into the filter, the coefficients of the "4 Stages" row 1700 of the coefficient table of FIG. 17 must also be demultiplexed into four paths. FIG. 18 depicts tables for each of the four paths. Leading zeros in each of the rows of FIG. 17 are discarded in FIG. 18.

Generation of the "Stage 4" rows of FIG. 18 will now be illustrated. Referring to the "4 Stages" row 1700 of FIG. 17, the first non-zero "A" coefficient listed is "1." The sequence must be decimated by four. The next term of the sequence is therefore "35." Skipping three more terms, the next term is "165." The terms of this decimated by four sequence appear in the "Stage 4" row 1800 of the "Path 4" table of FIG. 18.

Next, the "Stage 4" row 1802 of the "Path 3" table is determined. These terms are also obtained by decimating the "4 Stages" row 1700 of FIG. 17 by a factor of four. The "Path 3" sequence, however, is generated by starting with the second non-zero "A" coefficient of the "4 Stages" row 1700. Hence, the. "Stage 4" terms for "Path 3" are found to be "4, 56, 220, 560 . . . " The "Stage 4" rows 1804, 1806 of the "Path 2" and "Path 1" tables are similarly generated by beginning with the third and fourth non-zero "A" coefficients respectively of the "4 Stages" row 1700.

FIG. 19 illustrates a method for generating the "Stage 3," "Stage 2" and "Stage 1" rows for the four tables of FIG. 18. For example, in the "Path 1" table, the second term of the "Stage 3" row can be generated from the first and second terms of the "Stage 4" row. Following the method of FIG. 19, the first term of the "Stage 4" row, "20," is subtracted from second term of the "Stage 4" row, "120," to yield the second term of the "Stage 3" row, "100." To determine the first term of each row, zero is subtracted from the value of the first term of the row immediately above the term being determined. By following this method, each of the rows of FIG. 18 can be generated.

FIG. 20 depicts a structure functionally equivalent to the structure of FIG. 14. FIG. 20 is generated using the terms of the "Stage 1" rows of FIG. 18. First, the "Stage 1" row of the "Path 1" table of FIG. 18 is included in the structure. In FIG. 20, the first coefficient of the row, "20," is applied to the sample of the first path 2000 by a first multiplier 2002. The next coefficient of the row, "60," is applied by a second multiplier 2004 to those samples of the first path 2000 that have been delayed by a factor of one sample. The third coefficient, "64," is a repeating coefficient that is applied, via a third multiplier 2006, to all samples of the first path 2000 that have been delayed by a factor of two or more samples. This recursive delay, multiply by "64," and combine process is accomplished by integrating the output of multiplier 2006 with a first integrator 2012. The outputs of the first integrator 2012 and multipliers 2002, 2004 are then summed 2008. The result of the summation 2008 is processed by a cascade of three additional integrators 2010 to complete the four integrator stages for the first path 2000. In a similar fashion, the remaining "Stage 1" coefficients of FIG. 18 are included in the structure of FIG. 20, the outputs of which are all summed with the output of integrators 2010 to form the filter section output 1430.

After completing a structure such as depicted in FIG. 20, a streamlined structure such as that depicted in FIG. 14 is created. FIG. 14 is obtained by combining linear processing that is applied to each of the four paths. The structure of FIG. 14 has fewer multipliers, adders and integrators than does the structure of FIG. 20. Further, it is noted that, given that the input data samples are typically one bit each, the coefficient multiplies and accumulates can be performed in part by a read only memory using the delayed path data samples as address bits. Use of a read only memory in such a way will reduce the amount of hardware required and will help maintain a high processing speed.

FIGS. 21 and 22 depict tables used to verify that the pre-decimate by four methodology disclosed in relation to FIGS. 14 to 20 produces results equivalent to those that would be obtained via the post-decimate by four structure of FIG. 13. FIG. 21 depicts the sequence of outputs that would be output from the fourth integrator stage 1308 of the post-decimate by four structure of FIG. 13 upon receiving "A, B, C, D, E . . . " as input. The underlined terms in FIG. 21 indicate the output from the rate change component 1310 after the decimation. In FIG. 21, there are four different ways that the sequence can be decimated by four. In FIG. 21, decimation is accomplished by dropping three terms and keeping each fourth term.

FIG. 22 depicts outputs related to the pre-decimate by four structure of FIGS. 14–20. The lines designated as "Path 1," "Path 2," "Path 3" and Path 4" depict the first four outputs generated by each of the four paths. The "Path Sum" sequence of terms is the summation of the terms generated by each of the four paths. For instance, the first term of the "Path Sum" sequence is the summation of the first terms of each of the four paths. Likewise, the second term of the "Path Sum" sequence, 120A+84B+56C+35D+20E+10F+4G+H, is the summation of the second term of each of the four paths. This is the algorithm performed by FIG. 20 and its streamlined, functionally-equivalent structure in FIG. 14. As is clear from the underlined terms of FIG. 21 and the "Path Sum" sequence of FIG. 22, the outputs of the pre-decimate and the post-decimate structures are equivalent.

Using the procedure described above, it is also possible to configure circuits similar to FIG. 20 to obtain the other three possible decimated output sequences. This is accomplished by starting with the second, third or fourth leading zero terms of the "4 Stages" row of FIG. 17 and then decimating by four. Next, tables similar to those of FIG. 18 are generated. The circuit structure is then created using the terms of the "Stage 1" rows as coefficients. Any one of the four possible decimated output sequences, however, is all that is generally required.

While the pre-decimate structure has been illustrated and described for an apparatus having four integrator stages and a rate change factor of four, in other embodiments the invention has a different number of stages, a different rate change factor or both. In general, the invention can be said to work for a structure having "n" stages and a rate change factor of "r" (where "n" and "r" are positive integers). The rate change factor "r" determines the number of path tables that would be used, for example, in tables such as the path tables of FIG. 18. The number of stages "n" determines the number of rows that would be included in each FIG. 18 type of path table.

In addition, it is thought that the method and apparatus of the present invention will be understood from the appended claims and the description provided throughout this specification. Further, it will be apparent that various changes may be made in the form, construct steps and arrangement of the parts and steps thereof without departing from the spirit and scope of the invention or sacrificing its material advantages. The form herein described is merely a preferred exemplary embodiment thereof.

I claim:

1. A pre-decimated integrator filter section, comprising:
   a data rate change component;
   a first integrator structure comprising at least one recursive integrator stage, said first integrator structure receiving data at a rate established by said data rate change component, said first integrator structure modifying data received from said data rate change component; and
   a read only memory device, said read only memory device being used by said first integrator structure to modify data received from said data rate change component;
   wherein the pre-decimated integrator filter section outputs data equivalent to data that would be output by a post-decimated integrator filter section having an equal number of integrator stages.

2. The pre-decimated integrator filter section according to claim 1, further comprising a second integrator structure having one or more integrator stages.

3. The pre-decimated integrator filter section according to claim 1, wherein said first integrator structure comprises a recursive integrator stage and a plurality of multipliers.

4. The pre-decimated integrator filter section according to claim 1, wherein said data rate change component comprises a serial to parallel converter.

5. A method of performing a pre-decimated cascaded integration in a filter section, comprising the steps of:
   changing the data rate of data being received by an integrator structure;
   performing a first integration procedure on data received at the changed data rate, wherein the first integration procedure includes at least one recursive integrator stage;
   executing a second integration procedure on data output by said first integration procedure, wherein the second integration procedure includes a plurality of parallel recursive integrator stages; and
   outputting data equivalent to data that would be output by a post-decimated cascaded integrator having an equal number of integrator stages.

6. A method according to claim 5, wherein said changing step comprises converting a received serial data stream to a parallel signal having a plurality of parallel paths and decimating the received data by a factor equal to the number of parallel paths.

7. The method according to claim 5, wherein said performing step includes a combining procedure further modifying data received at the changed data rate.

8. A method of performing a pre-decimated cascaded integration in a filter section, comprising the steps of:
- changing the data rate of data being received by an integrator structure;
- performing a first integration procedure on data received at the changed data rate, wherein the first integration procedure includes at least one recursive integrator stage and wherein said performing step further comprises modifying the received data by multiplication by determined coefficients;
- executing a second integration procedure on data output by said first integration procedure, wherein the second integration procedure includes at least one additional recursive integrator stage; and
- outputting data equivalent to data that would be output by a post-decimated cascaded integrator having an equal number of integrator stages.

9. A pre-decimated integrator filter section, comprising:
a data rate change component; and
a first integrator structure comprising at least one recursive integrator stage, said first integrator structure receiving data at a rate established by said data rate change component, said first integrator structure modifying data received from said data rate change component by applying coefficients stored in a look-up table;
wherein the pre-decimated integrator filter section outputs data equivalent to data that would be output by a post-decimated integrator filter section having an equal number of integrator stages.

10. A pre-decimated integrator filter section, comprising:
a data rate change component; and
a first integrator structure comprising a plurality of reduced rate parallel signal paths with a recursive integrator stage and a plurality of coefficient multipliers for each path, said first integrator structure receiving data at a rate established by said data rate change component, said first integrator structure modifying data received from said data rate change component;
wherein the pre-decimated integrator filter section outputs data equivalent to data that would be output by a post-decimated integrator filter section having an equal number of integrator stages.

* * * * *